(12) United States Patent
Hera et al.

(10) Patent No.: US 10,752,169 B2
(45) Date of Patent: Aug. 25, 2020

(54) ENGINE SOUND MANAGEMENT

(71) Applicant: Bose Corporation, Framingham, MA (US)

(72) Inventors: Cristian Marius Hera, Lancaster, MA (US); Ben J. Feng, Sudbury, MA (US)

(73) Assignee: Bose Corporation, Framingham, MA (US)

(*) Notice: Subject to any disclaimer, the term of this patent is extended or adjusted under 35 U.S.C. 154(b) by 0 days.

(21) Appl. No.: 16/164,017

(22) Filed: Oct. 18, 2018

(65) Prior Publication Data

US 2019/0047471 A1 Feb. 14, 2019

Related U.S. Application Data

(63) Continuation of application No. 15/092,202, filed on Apr. 6, 2016, now Pat. No. 10,112,534, which is a
(Continued)

(51) Int. Cl.
| | |
|---|---|
| *B60Q 9/00* | (2006.01) |
| *B60W 50/14* | (2020.01) |
| *G10K 15/02* | (2006.01) |
| *H03G 9/00* | (2006.01) |
| *B60Q 5/00* | (2006.01) |

(Continued)

(52) U.S. Cl.
CPC ............... *B60Q 9/00* (2013.01); *B60Q 5/005* (2013.01); *B60W 50/14* (2013.01); *G10K 15/02* (2013.01); *H03G 5/16* (2013.01); *H03G 9/005* (2013.01); *H04R 1/22* (2013.01); *B60Q 5/008* (2013.01)

(58) Field of Classification Search
CPC . H04R 1/22; H03G 5/16; H03G 9/005; B60Q 5/005; B60Q 9/00; B60W 50/14; G10K 15/02
See application file for complete search history.

(56) References Cited

U.S. PATENT DOCUMENTS

2006/0269078 A1* 11/2006 Sakamoto ............ G10K 11/178
381/71.1
2009/0323983 A1* 12/2009 De Muynke ............ H04R 3/04
381/98

(Continued)

FOREIGN PATENT DOCUMENTS

| CN | 2368997 Y | 3/2000 |
|---|---|---|
| CN | 103392202 A | 11/2013 |
| JP | 2001071900 A | 3/2001 |

OTHER PUBLICATIONS

CN Office Action dated Aug. 7, 2019 for CN Appln. No. 201580011441.4.

*Primary Examiner* — Davetta W Goins
*Assistant Examiner* — Daniel R Sellers
(74) *Attorney, Agent, or Firm* — Bose Corporation

(57) ABSTRACT

In a vehicle equipped with a vehicle sound system, determining a virtual fixed gear ratio; determining a virtual RPM based on the virtual fixed gear ratio; generating a set of harmonic signals based on the virtual RPM, the harmonic signals being sine-wave signals proportional to harmonics of the virtual RPM; processing the harmonic signals to produce a set of processed harmonic signals; and in the vehicle sound system, transducing the processed harmonic signals to acoustic energy thereby to produce an engine sound within a passenger cabin of the vehicle.

6 Claims, 8 Drawing Sheets

Related U.S. Application Data continuation of application No. 14/152,538, filed on Jan. 10, 2014, now Pat. No. 9,333,911.

(51) Int. Cl.
*H03G 5/16* (2006.01)
*H04R 1/22* (2006.01)

(56) References Cited

U.S. PATENT DOCUMENTS

| | | | |
|---|---|---|---|
| 2012/0106748 A1* | 5/2012 | Peachey | B60Q 5/00 381/61 |
| 2012/0177214 A1* | 7/2012 | Hera | G10K 15/02 381/73.1 |
| 2013/0214921 A1* | 8/2013 | Meschke | B60Q 5/008 340/467 |

* cited by examiner

TABLE 1

| | RPM increases | RPM constant | RPM decreases |
|---|---|---|---|
| VSP increases | Regular acceleration control RPM = actual RPM | Main CVT sound problem Shift the pitch control RPM = virtual RPM | Sound problem: shift pitch control RPM = virtual RPM |
| VSP constant | Equivalent to downshifting control RPM = actual RPM | Cruising control RPM = actual RPM | Equivalent to upshifting control RPM = actual RPM |
| VSP decreases | Equivalent to downshifting control RPM = actual RPM | Driving uphill, high load Control RPM = actual RPM | Deceleration, low load control RPM = actual RPM |

FIG. 3

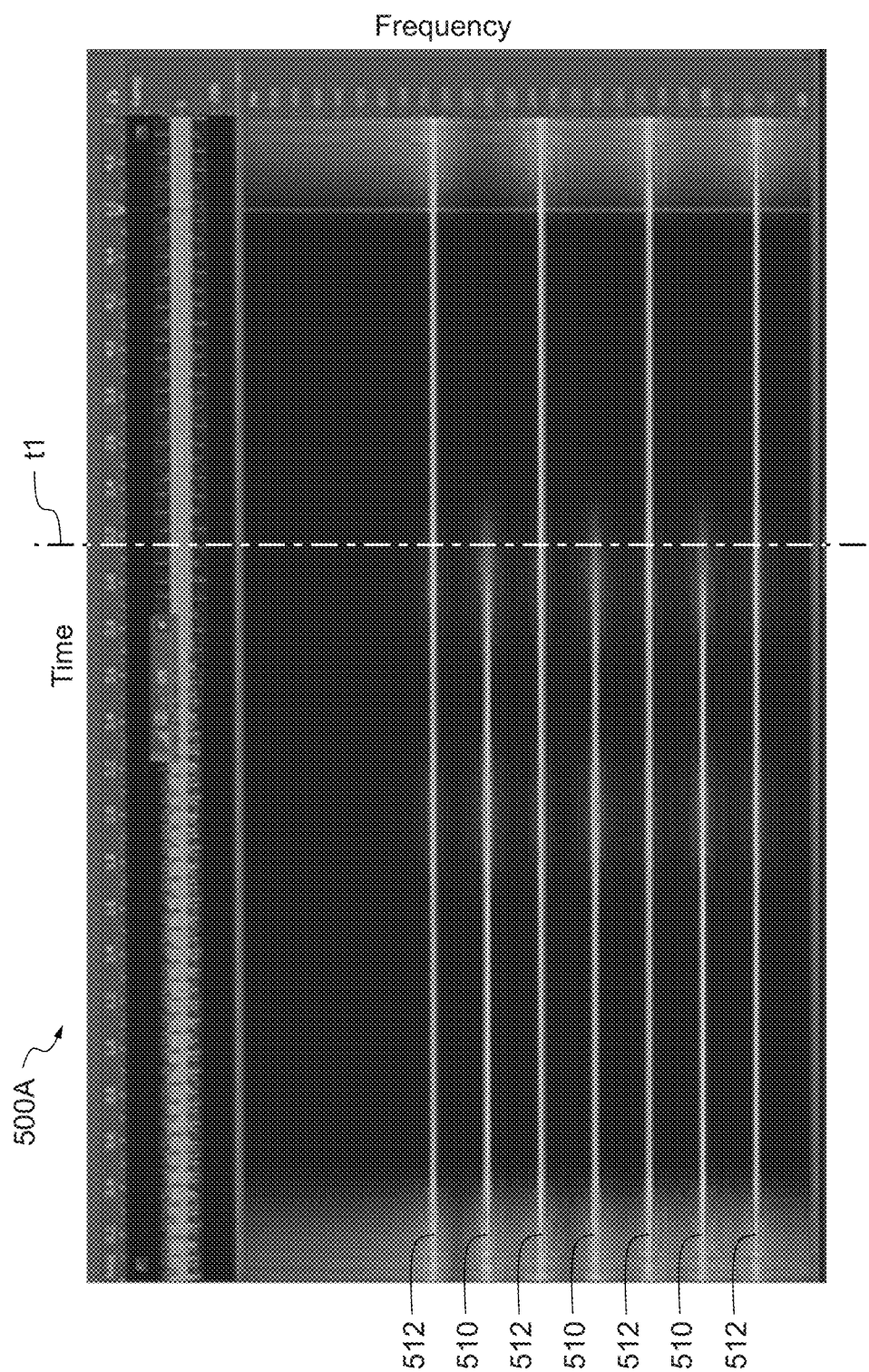

ENGINE SOUND MANAGEMENT

CROSS-REFERENCE TO RELATED APPLICATIONS

This application is a continuation of U.S. application Ser. No. 15/092,202, filed Apr. 6, 2016 which is a continuation of U.S. application Ser. No. 14/152,538, filed Jan. 10, 2014, now U.S. Pat. No. 9,333,911, each of which is incorporated herein by reference in its entirety.

BACKGROUND

This disclosure relates to sound management.

A considerable sound problem exists in vehicles equipped with Continuously Variable Transmission (CVT), i.e., when the vehicle accelerates a constant pitch is emitted for the engine. This sound problem is more pronounced for small displacement engines, which have a lower torque, and therefore, are more likely to operate under constant RPM conditions while accelerating.

In CVT equipped vehicles, an operator may notice that at some point during an acceleration cycle, an engine RPM reaches a value that stays relatively constant. At the same time, a speed of the vehicle continues to rise. When the operator requests the vehicle to accelerate and feels the acceleration, the sound of the CVT power train provides an incorrect sound feedback, suggesting that the vehicle is not accelerating. This is not just a power train (PT) sound quality problem, but can also be a safety issue, since the operator may be tempted to further accelerate.

A similar sound problem exists in electric vehicles and hybrid vehicles running in an electric mode.

SUMMARY

In one aspect, a method includes, in a vehicle equipped with a vehicle sound system, determining a virtual fixed gear ratio; determining a virtual RPM based on the virtual fixed gear ratio; generating a set of harmonic signals based on the virtual RPM, the harmonic signals being sine-wave signals proportional to harmonics of the virtual RPM; processing the harmonic signals to produce a set of processed harmonic signals; and in the vehicle sound system, transducing the processed harmonic signals to acoustic energy thereby to produce an engine sound within a passenger cabin of the vehicle.

Implementations may include one of the following features, or any combination thereof.

In some examples, the vehicle is equipped with a continuously variable transmission, and the virtual fixed gear ratio is determined based on a current gear ratio of the continuously variable transmission which varies continuously in time as a function of an actual, measured RPM and vehicle speed. The virtual RPM changes with the vehicle speed when the actual RPM remains constant.

In some implementations, the virtual fixed gear ratio is determined according to: $GR_{virtual}(t) = c \cdot f(GR_{CVT}(t))$, where $GR_{virtual}(t)$ is the virtual fixed gear ratio; c is a constant; $GR_{CVT}(t)$ is the current gear ratio of the CVT; and $f(GR_{CVT}(t))$ is a mapping function for mapping the current gear ratio to a set of predefined virtual fixed gear ratios.

In certain implementations, the virtual fixed gear ratio is determined according to: $GR_{virtual}(t) = c(t) \cdot f(GR_{CVT}(t))$, where $GR_{virtual}(t)$ is the virtual fixed gear ratio; c(t) is a variable that varies as a function of a measured engine load; $GR_{CVT}(t)$ is the current gear ratio of the CVT; and $f(GR_{CVT}(t))$ is a mapping function for mapping the current gear ratio to a set of predefined virtual fixed gear ratios.

In some examples, virtual fixed gear ratio is determined according to: $GR_{virtual}(t) = c(t) \cdot f(GR_{CVT}(t))$, where $GR_{virtual}(t)$ is the virtual fixed gear ratio; c(t) is a variable that varies as a function of a measured accelerator pedal position; $GR_{CVT}(t)$ is the current gear ratio of the CVT; and $f(GR_{CVT}(t))$ is a mapping function for mapping the current gear ratio to a set of predefined virtual fixed gear ratios.

In certain examples, the virtual fixed gear ratio is determined according to: $GR_{virtual}(t) = c(t) \cdot f(GR_{CVT}(t))$, where c(t) is a variable that varies as a function of a measured engine load and a measured accelerator pedal position, and $f(GR_{CVT}(t))$ is a mapping function for mapping the current gear ratio ($GR_{CVT}(t)$) to a set of predefined virtual fixed gear ratios.

In some cases, determining the virtual fixed gear ratio includes mapping the current gear ratio to one of a set of predefined fixed gear ratios according to a mapping function. The mapping function $f(GR_{CVT}(t))$ is expressed as:

$$f(GR_{CVT}(t)) = \begin{cases} gr_1, & \text{if } th_1 \leq GRcvt(t) \\ gr_2, & \text{if } th_2 \leq GRcvt(t) \leq th_1 \\ \vdots \\ gr_N, & \text{if } GRcvt(t) \leq th_N \end{cases},$$

where $GR_{CVT}(t)$ is the current gear ratio of the CVT; $\{gr_n\}$ is the set of predefined fixed gear ratios; and $\{th_n\}$ is a set of predefined gear ratio thresholds.

In some cases, the method includes determining the current gear ratio according to:

$$GR_{CVT}(t) = \frac{RPMactual(t)}{VSP(t)} \cdot CR,$$

where $GR_{CVT}(t)$ is the current gear ratio of the CVT; and CR is a constant that captures fixed transmission ratios external to the CVT.

In some implementations, the method includes determining if sound correction is necessary. If sound correction is necessary, then the method also includes calculating an instantaneous value of the current gear ratio of the CVT, setting the virtual fixed gear ratio to the instantaneous value of the current gear ratio of the CVT and maintaining the virtual gear ratio constant at the calculated instantaneous value of the current gear ratio until a gear ratio deviation of the virtual fixed gear ratio relative to the current gear ratio exceeds a gear ratio deviation value.

In certain implementations, the method includes determining the gear ratio deviation according to:

$$\Delta GR(t) = c \cdot \frac{GR_{virtual}(t) - GR_{CVT}(t)}{GR_{virtual}(t)},$$

where $\Delta GR(t)$ is the gear ratio deviation; $GR_{virtual}(t)$ is the virtual fixed gear ratio; $GR_{CVT}(t)$ is the current gear ratio of the CVT; and c is a constant.

In some examples, the method includes determining the gear ratio deviation according to:

$$\Delta GR(t) = c(t) \cdot \frac{GR_{virtual}(t) - GR_{CVT}(t)}{GR_{virtual}(t)},$$

where $\Delta GR(t)$ is the gear ratio deviation; $GR_{virtual}(t)$ is the virtual fixed gear ratio; $GR_{CVT}(t)$ is the current gear ratio of the CVT; and $c(t)$ is a variable that varies as a function of a measured engine load.

In certain examples, the method includes determining the gear ratio deviation according to:

$$\Delta GR(t) = c(t) \cdot \frac{GR_{virtual}(t) - GR_{CVT}(t)}{GR_{virtual}(t)},$$

where $\Delta GR(t)$ is the gear ratio deviation; $GR_{virtual}(t)$ is the virtual fixed gear ratio; $GR_{CVT}(t)$ is the current gear ratio of the CVT; and $c(t)$ is a variable that varies as a function of accelerator pedal position.

In some cases, the method includes determining the gear ratio deviation according to: $\Delta GR(t) = c \cdot (GR_{virtual}(t) - GR_{CVT}(t))$, where $\Delta GR(t)$ is the gear ratio deviation; $GR_{virtual}(t)$ is the virtual fixed gear ratio; $GR_{CVT}(t)$ is the current gear ratio of the CVT; and $c$ is a constant.

In certain cases, the method includes determining the gear ratio deviation according to: $\Delta GR(t) = c(t) \cdot (GR_{virtual}(t) - GR_{CVT}(t))$, where $\Delta GR(t)$ is the gear ratio deviation; $GR_{virtual}(t)$ is the virtual fixed gear ratio; $GR_{CVT}(t)$ is the current gear ratio of the CVT; and $c(t)$ is a variable that varies as a function of a measured engine load.

In some implementations, the method includes determining the gear ratio deviation according to: $\Delta GR(t) = c(t) \cdot (GR_{virtual}(t) - GR_{CVT}(t))$, where $\Delta GR(t)$ is the gear ratio deviation; $GR_{virtual}(t)$ is the virtual fixed gear ratio; $GR_{CVT}(t)$ is the current gear ratio of the CVT; and $c(t)$ is a variable that varies as a function of a measured accelerator pedal position.

In certain implementations, determining if sound correction is necessary includes determining that $\Delta RPM$ does not exceed a maximum value Rmax, and determining that $\Delta VSP$ exceeds a minimum value, Vmax.

In some examples, determining if sound correction is needed includes determining that $\Delta RPM$ exceeds a minimum value Rmin.

In certain examples, the virtual fixed gear ratio is determined according to:

$$GR_{virtual}(t) = \begin{cases} GR_{virtual}(t-1), & \text{if correction needed, and } \Delta GR(t-1) < A \\ GR_{CVT}(t), & \text{otherwise} \end{cases},$$

where $GR_{virtual}(t)$ is the virtual fixed gear ratio; $GR_{virtual}(t-1)$ is a previously determined virtual fixed gear ratio determined at time $t-1$; $GR_{CVT}(t)$ is the current gear ratio of the CVT; and the parameter A is tunable and represents the desired vs. actual gear ratio deviation that will trigger a gear shift.

In some cases, the virtual RPM is determined according to: $RPM_{virtual}(t) = GR_{virtual}(t) \cdot VSP(t) \cdot CR^{-1}$, where $RPM_{virtual}(t)$ is the virtual RPM; $GR_{virtual}(t)$ is the virtual fixed gear ratio; $VSP(t)$ is the vehicle speed; and CR is a constant that captures fixed transmission ratios external to the CVT.

In certain cases, the method includes generating a set of harmonic cancellation signals based on the actual RPM, the harmonic signals being sine-wave signals proportional to harmonics of the actual RPM; processing the harmonic cancellation signals to produce a set of processed harmonic cancellation signals; and, in the vehicle sound system, transducing the processed harmonic cancellation signals to acoustic energy thereby to produce an engine sound within a passenger cabin of the vehicle, In some implementations, processing the harmonic cancellation signals includes, for each of the harmonic cancellation signals of the set of harmonic cancellation signals, modifying the amplitude and/or phase of the harmonic cancellation signal with an adaptive filter.

In certain implementations, processing the harmonic cancellation signals includes, for each of the harmonic cancellation signals of the set of harmonic cancellation signals, adjusting an amplitude of the harmonic cancellation signal as a function of a measured engine load or accelerator pedal position.

In certain examples, processing the harmonic signals includes for each of the harmonic signals of the set of the harmonic signals, applying a corresponding gain as a function of the virtual RPM.

In some cases, processing the harmonic signals includes for each of the harmonic signals of the set of the harmonic signals, applying a gain as a function of a measured engine load or accelerator pedal position.

In certain cases, the vehicle is equipped with an electric motor, and the virtual RPM can then be determined based on vehicle speed and predefined virtual gear ratios.

In some implementations, the vehicle is a hybrid vehicle capable of operating in an internal combustion (IC) mode and an electric vehicle (EV) mode. When operating in the EV mode the virtual RPM is determined based on vehicle speed and a first set of predefined virtual gear ratios, and, when operating in IC mode the virtual RPM is determined based on an actual RPM measured from an internal combustion engine of the hybrid vehicle, vehicle speed, and a second set of predefined virtual gear ratios.

In another aspect, a method includes: in a vehicle equipped with a continuously variable transmission (CVT) and a vehicle sound system, determining if sound correction is necessary. If sound correction is not necessary, then the method also includes generating a set of harmonic signals based on an actual, measured RPM, the harmonic signals being sine-wave signals proportional to harmonics of the actual RPM. If sound correction is necessary, then the method also includes determining a virtual fixed gear ratio based on a current gear ratio of the continuously variable transmission which varies continuously in time as a function of an actual, measured RPM and vehicle speed; determining a virtual RPM based on the virtual fixed gear ratio generating a set of harmonic signals based on the virtual RPM, the harmonic signals being sine-wave signals proportional to harmonics of the virtual RPM; processing the harmonic signals to produce a set of processed harmonic signals; and in the vehicle sound system, transducing the processed harmonic signals to acoustic energy thereby to produce an engine sound within a passenger cabin of the vehicle. The virtual RPM changes with the vehicle speed even when the actual RPM remains constant.

Implementations may include one of the above and/or below features, or any combination thereof.

In some implementations, determining if sound correction is necessary includes determining that $\Delta RPM$ does not exceed a maximum value Rmax, and determining that ΔVSP exceeds a minimum value Vmax.

In certain implementations, determining if sound correction is needed further includes determining that ΔRPM exceeds a minimum value Rmin.

Another aspect features a method that includes, in a vehicle equipped with a vehicle sound system, providing harmonics of a fundamental frequency which increases with time; and generating an increasing pitch via the vehicle sound system by transducing the harmonics in a limited frequency range. Generating the increasing pitch includes separately decreasing amplitudes of the harmonics as each of the harmonics approach an upper limit of the frequency range such that the harmonics become inaudible as they individually reach the upper limit of the frequency range. As one of the harmonics becomes inaudible, another one of the harmonics becomes audible.

Implementations may include one of the above and/or below features, or any combination thereof.

In some implementations, the fundamental frequency is representative of an actual, measured vehicle RPM that increases with time.

In certain implementations, the vehicle is equipped with an electric motor, and the fundamental frequency is representative of an actual RPM of the electric motor.

In some examples, the fundamental frequency is representative of a virtual RPM which is determined based on a set of predefined virtual fixed gear ratios.

BRIEF DESCRIPTION OF THE DRAWINGS

FIG. 3 is table illustrating one exemplary set of criteria; and

FIGS. 5A, 5B, and 6 are spectrograms illustrating psychoacoustic approaches to pitch shifting.

DETAILED DESCRIPTION

Figure 1A:
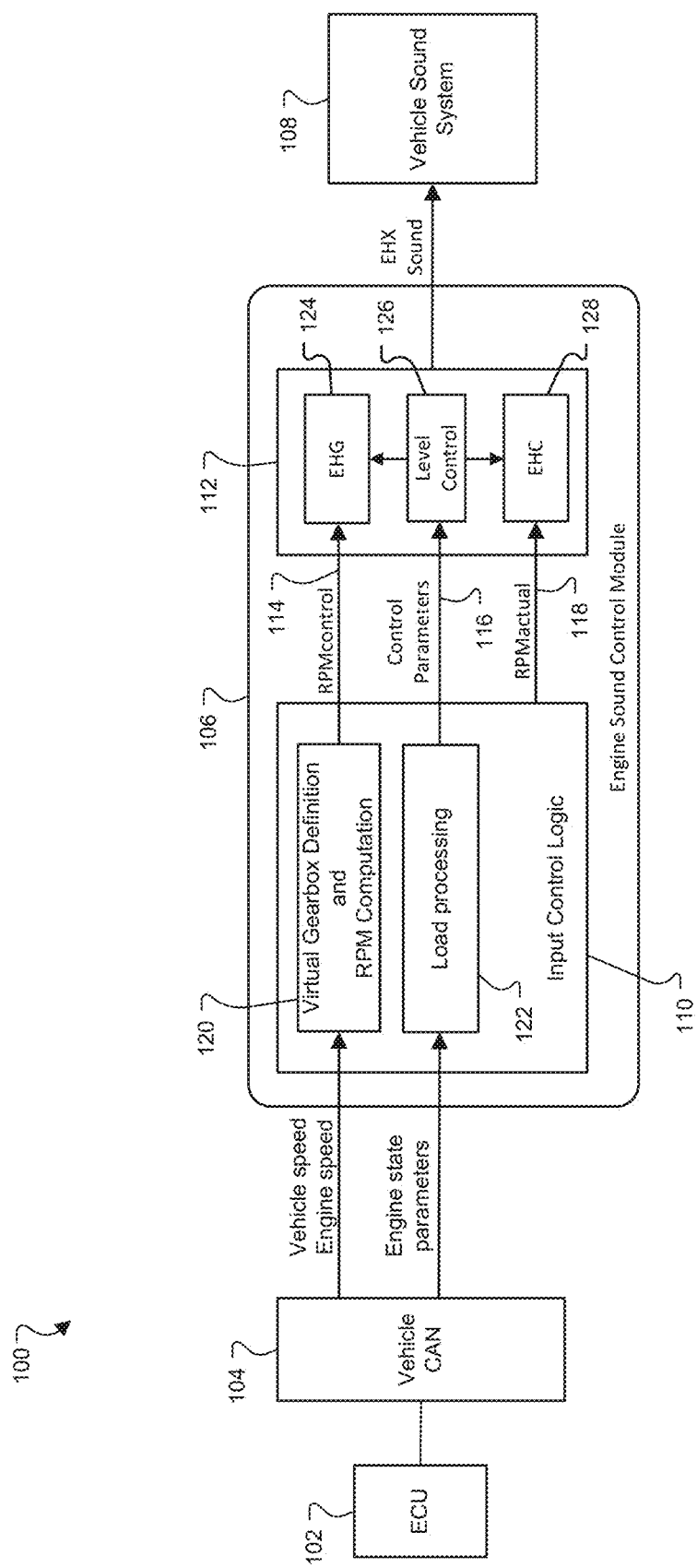
FIG. 1A is a block diagram of an exemplary engine sound management system.

This disclosure is based, at least in part, on the realization that, in a vehicle which includes a continuously variable transmission, a perceived engine sound can be correlated with a vehicle's acceleration such that the engine sound pitch increases as long as the vehicle accelerates. This can be achieved by introducing a disruption in the signal that controls pitch, i.e., the engine speed (RPM). The disruption can be introduced at least during acceleration cycles when the RPM remains constant.

The disruption can be thought of as being introduced by a virtual, desired RPM, corresponding to a virtual, desired powertrain (virtual gearbox). The virtual gearbox is used, and tuned, for achieving the desired variation in the sound of the vehicle.

Though the elements of several views of the drawing may be shown and described as discrete elements in a block diagram and may be referred to as "circuitry," unless otherwise indicated, the elements may be implemented as one of, or a combination of, analog circuitry, digital circuitry, or one or more microprocessors executing software instructions. The software instructions may include digital signal processing (DSP) instructions. Operations may be performed by analog circuitry or by a microprocessor executing software that performs the mathematical or logical equivalent to the analog operation. Unless otherwise indicated, signal lines may be implemented as discrete analog or digital signal lines, as a single discrete digital signal line with appropriate signal processing to process separate streams of signals, or as elements of a wireless communication system. Some of the processes may be described in block diagrams. The activities that are performed in each block may be performed by one element or by multiple elements, and may be separated in time. The elements that perform the activities of a block may be physically separated. Unless otherwise indicated, signals may be encoded and transmitted in either digital or analog form; conventional digital-to-analog or analog-to-digital converters may not be shown in the figures.

As shown in FIG. 1A, an exemplary engine sound management system 100 includes an engine control unit (ECU) 102 operationally linked to a vehicle controller area network (CAN) bus 104. The CAN bus 104 is operationally linked to an engine sound control module 106. The engine sound control module 106 is operationally linked to a vehicle sound system 108.

The ECU 102 monitors various vehicle engine load parameters, such as actual vehicle speed (VSP), actual engine revolutions per minute (RPM), and so forth. Some of these monitored parameters, such as vehicle speed, engine RPM and engine state parameters, for example, may be used as input by the engine sound control module 106.

The engine sound control module 106 enables a change of an engine sound by canceling some harmonics, enhancing other harmonics, and generating new harmonics, in such a way that a perceived pitch of the engine sound is changing. This disclosure describes the control algorithm that can be used to drive the sound changes.

The engine sound control module 106 includes input control logic 110 and an engine harmonic management (EHX) sub-system 112. The input control logic 110 provides a signal representative of a control RPM M (RPM$_{control}$) 114, a signal representative of control parameters 116, and a signal representative of the actual, measured engine RPM (RPM$_{actual}$) 118 as input to the EHX sub-system 112. Signals produced by the EHX sub-system 112, based on the input received from the input control logic 110, are transduced to acoustic energy by one or more speakers within the vehicle sound system 108 positioned within an interior of a vehicle and provide a desired sonic experience.

The input control logic 110 includes a virtual gearbox and RPM computation module 120 which provides the control RPM (RPM$_{control}$) 114, as will be discussed below, and a load processing module 122 which provides the control parameters 116.

All or some of the engine sound control module 106, input control logic 110, the virtual gearbox and RPM computation module 120, the load processing module 122, and the EHX sub-system 112 may be implemented as software instructions executed by one or more microprocessors or DSP chips, which may be components of an amplifier.

The EHX sub-system 112 includes an engine harmonics generation (EHG) module 124, a level control module 126 and an engine harmonics cancellation (EHC) module 128. The EHG module 124 receives the control RPM 70 from the virtual gearbox and RPM computation module 120. All or some of the EHG module 124, the level control module 126, and the EHC module 128, may be implemented as software instructions executed by one or more microprocessors or DSP chips, which may be components of an amplifier.

Figure 1B:
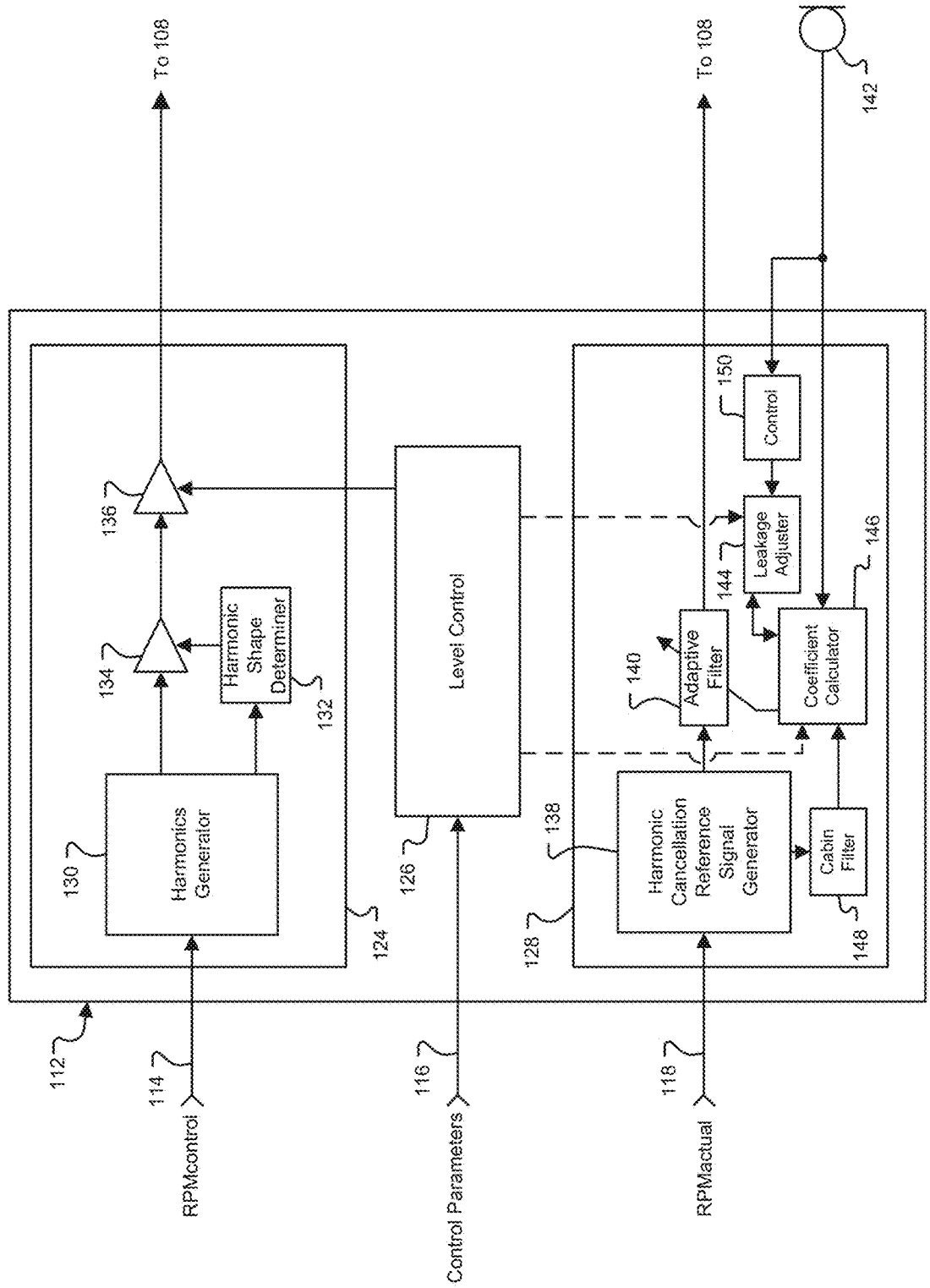
FIG. 1B is a block diagram of an engine harmonic management (EHX) sub-system from the engine sound management system of FIG. 1A.

Referring to FIG. 1B, the EHG module 124 includes a harmonics generator 130 for generating sine-wave signals proportional to certain harmonics (i.e., harmonics, which could include non-integer harmonics, of a fundamental frequency) of the control RPM. The harmonics generator 130 determines and outputs two parameters for each harmonic. To determine the first parameter, the harmonics generator 130 computes the frequency for each harmonic of the control RPM by multiplying the fundamental frequency by the order of each harmonic and outputs a sinusoid signal at the frequency. To determine a second parameter, the harmonics generator 130 converts the fundamental frequency into an index to a harmonic shape, that is, it determines a sound pressure level (SPL) for each harmonic as the SPL varies with RPM. Typically, the harmonic shape is expressed as a Look-Up Table (LUT). Alternately, the harmonic shape may be calculated or approximated according to a formula.

The EHG module 124 also includes harmonic shape determiners 132 (one shown for simplicity) and harmonic gains 134 (one shown for simplicity) for each harmonic generated. The harmonic shape determiners 132 are typically implemented as frequency-to-gain look-up tables (LUTs), which enables the sound level of each harmonic to be frequency dependent. Alternatively, the harmonic shape may be calculated or approximated according to a formula. This shape control outputs a gain which adjusts the level of the corresponding harmonic. The resulting harmonic signal produces a sound level that matches a desired target. To achieve this goal the look-up table must account for the inherent harmonic level, the target harmonic level, and the transfer function of the vehicle sound system.

The harmonic gains 134 (one shown for simplicity) apply individual harmonic specific gains to each of the harmonic signals, based on input from the harmonic shape LUTs 132 and the instantaneous values of the sinusoids for each of the harmonic frequencies determined by the harmonics generator 130. The EHG module 124 can also include other harmonic gains 136 which can be utilized for adjusting the respective levels of the individual harmonic signals based on load.

The gain adjusted harmonic signals are then provided to the vehicle sound system 108 and transduced to acoustic energy by the speakers. In some cases, the gain adjusted harmonic signals may be combined into a harmonic control signal and the harmonic control signal is provided to the vehicle sound system 108. When the control RPM corresponds to the actual engine RPM, the EHG module 50 will provide engine harmonic enhancement of certain harmonics of the actual engine RPM. When the control RPM is a virtual RPM, as will be discussed below, the EHG module 50 will generate sine-wave signals proportional to certain harmonics of the virtual RPM.

All or some of the harmonics generator 130, the harmonic shape determiners 132, the harmonic gains 132, and the other harmonic gains 134, may be implemented as software instructions executed by one or more microprocessors or DSP chips, which may be components of an amplifier.

The EHC module 128 receives an actual, measured engine RPM 118 (i.e., a signal representative of the actual, measured engine RPM) from the input control logic 110. The EHC module 128 includes a harmonic cancellation reference signal generator 138 for generating harmonic cancellation signals, which are sine-wave reference signals proportional to certain harmonics of the actual measured engine RPM ($RPM_{actual}$).

The EHC module 128 also includes adaptive filters 140 for modifying the respective phases and/or amplitudes of the individual harmonic cancellation signals, based on input from one or more microphones 142 (one shown) mounted in the passenger cabin of the vehicle, to generate modified harmonic cancellation signals to minimize signals detected at the one or more microphones 142.

Each of the adaptive filters 140 has associated with it a leakage adjuster 144 (one shown), a coefficient calculator 146, a cabin filter 148, and a control block 150. For simplicity, only a single adaptive filter 140, leakage adjuster 144, coefficient calculator 146, cabin filter 148, and control block 150 are shown; however, these elements may be replicated and used to generate and modify a noise reduction signal for each harmonic to be cancelled or reduced.

The control blocks 150 control the operation of the associated harmonic cancellation elements, for example by activating or deactivating the EHC module 128 or by adjusting the amount of noise attenuation. The cabin filters 148 model and compensate for a transfer function that characterizes the combined effect of some electro-acoustic elements, for example, the speaker(s), the microphone(s) 142, and of the environment within which the EHX subsystem 112 operates. The adaptive filters 140, the leakage adjusters 144, and the coefficient calculators 146 operate repetitively and recursively to provide streams of filter coefficients to modify the individual harmonic cancellation signals. Suitable adaptive algorithms for use by the coefficients calculators may be found in Adaptive Filter Theory, 4th Edition by Simon Haykin, ISBN 013091261. The leakage adjusters 144 select a leakage factor to be applied by the corresponding one of the coefficient calculators 146. A leakage factor is a factor applied in the corresponding one of the adaptive filters 140 to an existing coefficient value when the existing coefficient value is updated by an update amount. Information on leakage factors may be found in Section 13.2 of Adaptive Filter Theory, 4th Edition by Simon Haykin, ISBN 013091261.

The modified harmonic cancellation signals are then provided to the vehicle sound system 108 and transduced to acoustic energy by the speakers. In some cases, the modified harmonic cancellation signals may be combined with each other and/or with the gain adjusted harmonic signals before being provided the vehicle sound system 108.

All or some of the harmonic cancellation reference signal generator 138, the adaptive filters 140, the leakage adjusters 144, the coefficient calculators 146, the cabin filters 148, and the control blocks 150 may be implemented as software instructions executed by one or more microprocessors or DSP chips, which may be components of an amplifier.

For achieving a natural sound, it can be beneficial to process the load information used for controlling a level of the engine sound (e.g., enhanced or canceled).

In this regard, the load processing module 122 receives an input signal representative of engine load from the vehicle CAN bus 104 and converts it to control parameters 116 which are provided to the level control module 126.

The load processing module 122 is used for determining the inherent engine sound level to properly balance the sound augmentation. A signal representing engine load is well suited for controlling sound augmentation level for at least two reasons. First, overall engine noise levels increase monotonically with increasing positive engine loads. Second, strong enhancement and/or the generation of new harmonics is typically desirable only for positive engine loads, when the engine propels the transmission. Negative engine loads occur when the transmission propels the engine, also known as engine brake. While there may be high levels of inherent engine noise for during engine brake, noise cancellation may be desired for this situation but significant sound enhancement (including the generation of new harmonics) is rarely desired.

The vehicle CAN bus 104 will typically have available several of the following signals which correlate well with the engine load and may be available to the load processing module 122 either in analog or digital form, for example, accelerator pedal position (APP); throttle position sensor (TPS); mass air flow (MAF); manifold absolute pressure (MAP); engine torque; and/or computed engine load.

The load processing module 122 may convert the input signal from a native data form to a form more useful to the EHX sub-system 112. For example, if the engine load signal is representative of the engine torque, the load processing module 122 may convert the torque measurement to an engine load measurement. The engine load may be expressed as an index; for example, the maximum engine load may be expressed as a number from 1-100. Likewise, the load processing module 122 may, alternatively or additionally, convert other parameter value signals from a native form into a form more useful by the EHX sub-system 112.

The level control module 126 receives the control parameters 116 as input from the load processing module 122. Based on the input from load processing module 122, the level control module 126 determines a gain to be applied by corresponding harmonic gains 136, thereby providing a different harmonic shape depending on engine load. The input from the level control module 126 may also be used in the control loop of the EHC module 128, possibly for adjusting the leakage factor provided by the leakage adjuster 144 or for utilization by the coefficient calculator block 146. In the latter case, the error used in the coefficient update algorithm will be computed relative to a predefined harmonic shape, which can scaled based on the input received from the level control module 126.

All abrupt transitions in the signals used for harmonic generation or cancellation, can be smoothed or introduced gradually, in order to avoid any distortions in the acoustic domain.

Based on a desired engine sound for a vehicle, one can predefine gear ratios to be used within the virtual gearbox definition and RPM computation module 120 and the sound targets for each harmonic that is generated, enhanced or canceled by the EHX sub-system 112.

There are several ways to change the engine sound, to induce a change in the perceived pitch of such sound, when a vehicle accelerates but the engine RPM remains constant. For example, a first approach is to use a virtual RPM (RPM virtual) to control perceived pitch changes. This virtual RPM is based on a virtual gear box with fixed gear ratios.

A second approach is to use a control RPM (RPM$_{control}$), which alternates between the virtual RPM and the actual engine RPM (RPM$_{actual}$), to control perceived changes in engine sound pitch. The virtual RPM is based on a virtual gear box with fixed gear ratios. The control RPM, when used to control the sound of the engine, uses the virtual RPM only when the actual engine RPM remains relatively constant. In all other conditions, the control RPM is the actual engine RPM.

A third approach is to use a control RPM, using both the virtual RPM and the actual engine RPM, as described above, but have the virtual RPM computed using time dependent discrete gear ratios instead of predefined virtual fixed gear ratios.

Pitch Shifting Controlled by Virtual RPM

In the first approach, a virtual RPM (RPM virtual) is computed in the virtual gearbox definition and RPM computation module 120 and is the single piece of information used to induce a shift in the perceived pitch of the engine sound, regardless of the actual engine RPM. In this case, the control RPM that is provided to the EHX sub-system 112 corresponds to the virtual RPM.

For example, a current CVT gear ratio, GR$_{CVT}$, may be defined as:

$$GR_{CVT}(t) = \frac{RPMactual(t)}{VSP(t)} \cdot CR \quad (1)$$

where t is time and CR is a constant that captures all the fixed transmission ratios external to the gearbox, such as the rear differential transmission ratio, tire circumference, and so forth. The CVT gear ratio varies continuously in time.

A vehicle manufacturer can predefine a set of fixed gear ratios, to which the virtual gearbox definition and RPM computation module 120 can map the variable CVT gear ratios (GR$_{CVT}$). For example, if $f(\cdot)$ is a mapping function, c is a constant, a virtual gear ratio, GR$_{virtual}$(t), may be computed as follows:

$$GR_{virtual}(t) = c \cdot f(GR_{CVT}(t)) \quad (2)$$

The mapping function may then be expressed as:

$$f(GR_{CVT}(t)) = \begin{cases} gr_1, & \text{if } th_1 \leq GRcvt(t) \\ gr_2, & \text{if } th_2 \leq GRcvt(t) \leq th_1 \\ \vdots \\ gr_N, & \text{if } GRcvt(t) \leq th_N \end{cases} \quad (3)$$

where $\{gr_N\}$ is the set of fixed virtual gear ratios and $\{th_N\}$ is the set of predefined gear ratio thresholds. In some cases, the constant c may be set to one. In the tuning process, it can be used as a simple way to scale the gear ratios, if desired, without changing the threshold thy. The constant c controls the slope at which the virtual RPM increases.

The virtual RPM, RPM$_{virtual}$(t), can then be computed by the virtual gearbox and RPM computation module 120 as:

$$RPM_{virtual}(t) = GR_{virtual}(t) \cdot VSP(t) \cdot CR^{-1} \quad (4)$$

In this example, the virtual RPM computation is based on a set of predefined, virtual, gear ratios. The values of these gear ratios are tunable within the engine sound control module 106 by a vehicle manufacturer to achieve a desired engine sound. A signal representative of the virtual RPM is provided to the EHG module 124 which generates sine-wave reference signals that are proportional to the harmonics of the virtual RPM. The harmonics signals can then be transduced to acoustic energy via speakers in the vehicle sound system 108, thereby to produce an engine sound in the vehicle cabin via the vehicle sound system 108.

Figure 2:
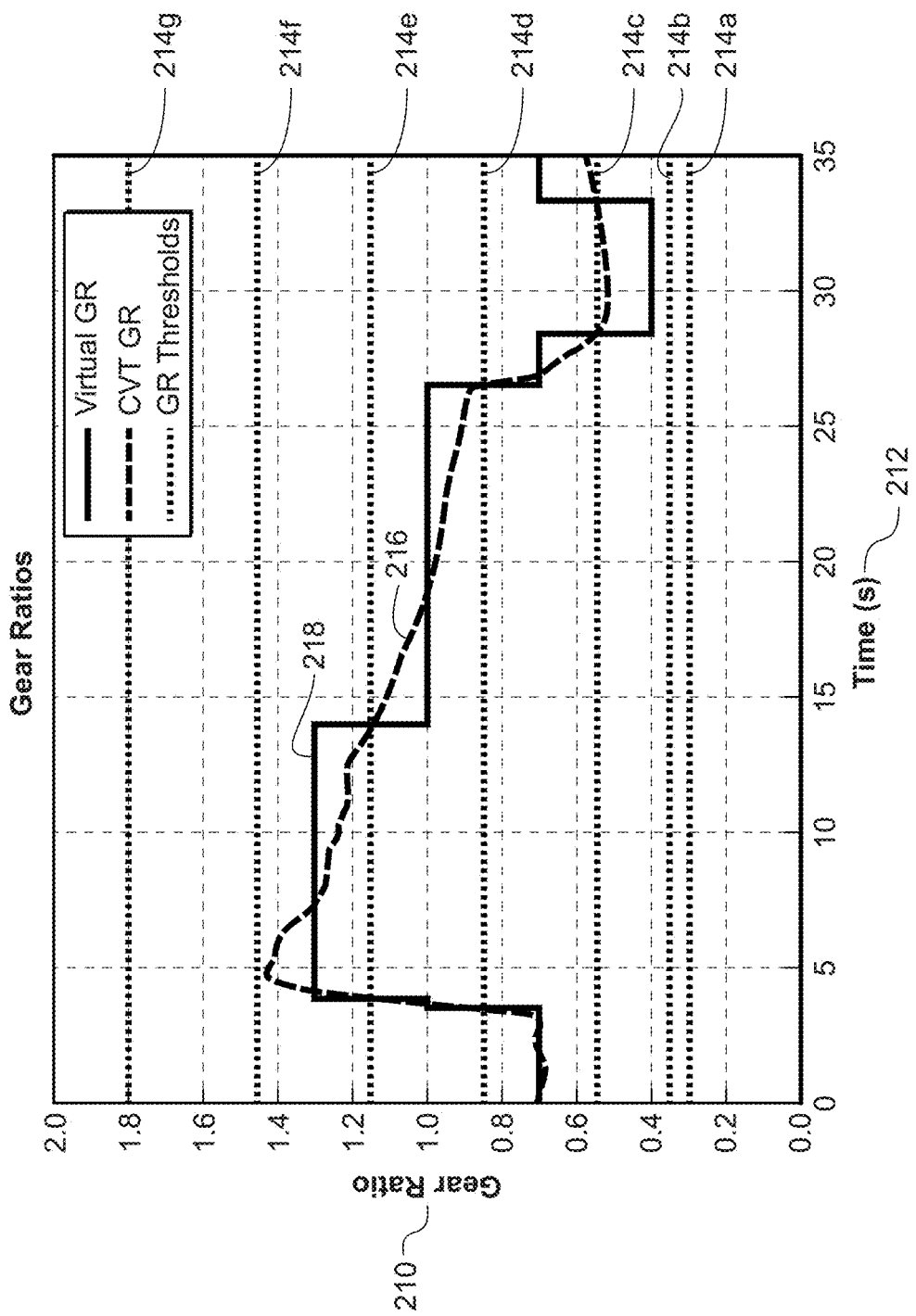
FIG. 2 is an exemplary graph illustrating a sample gear ratio mapping used in the engine sound management system.

As shown in FIG. 2, an exemplary graph 200 illustrates a sample gear ratio mapping using the principles described above. The graph 200 plots gear ratio 210 versus time 212. The gear ratio 210 values range from a low of 0.2 to a high of 2.0. Predefined gear ratio thresholds 214a-g are shown as dotted lines from time=0 to time=35. As time 212 increases, an actual gear ratio 216 increases initially and then decreases, while the virtual gear ratios 218 remain more constant while increasing and decreasing, illustrating a more step-like progression similar to a manual gear box. In the CVT engine, the actual gear ratio 216 varies continuously over time.

Pitch Shifting Controlled by Alternating Control RPM

As mentioned above, pitch shifting may be controlled using a control RPM that alternates between the calculated, virtual RPM and the actual, measured engine RPM ($RPM_{actual}$), rather than using the virtual RPM alone. In this approach, the virtual gearbox definition and RPM computation module 120 may include control RPM selection logic which alternates the control RPM the actual engine RPM ($RPM_{actual}$) and the virtual RPM virtual) according to a set of criteria including driving situation and actual engine parameters. One exemplary set of criteria is shown in FIG. 3 in Table 1. In Table 1, VSP represents actual vehicle speed. The set of criteria represent how the virtual gearbox definition and RPM computation module 120 determines the control RPM as the VSP remains constant, increases or decreases, in conjunction with an engine RPM as it increases, decreases or remain constant. For example, as seen in Table 1, a main CVT engine sound problem is generally associated with a condition of the VSP increasing and the RPM remaining constant. When this occurs, the virtual gearbox definition and RPM computation module 120 sets the control RPM to the virtual RPM. The control RPM is provided to the EHX sub-system 112.

In other examples, a rate of change in actual engine RPM or vehicle speed may be used to improve performance. In addition, engine load conditions may be taken into consideration.

Figure 4:
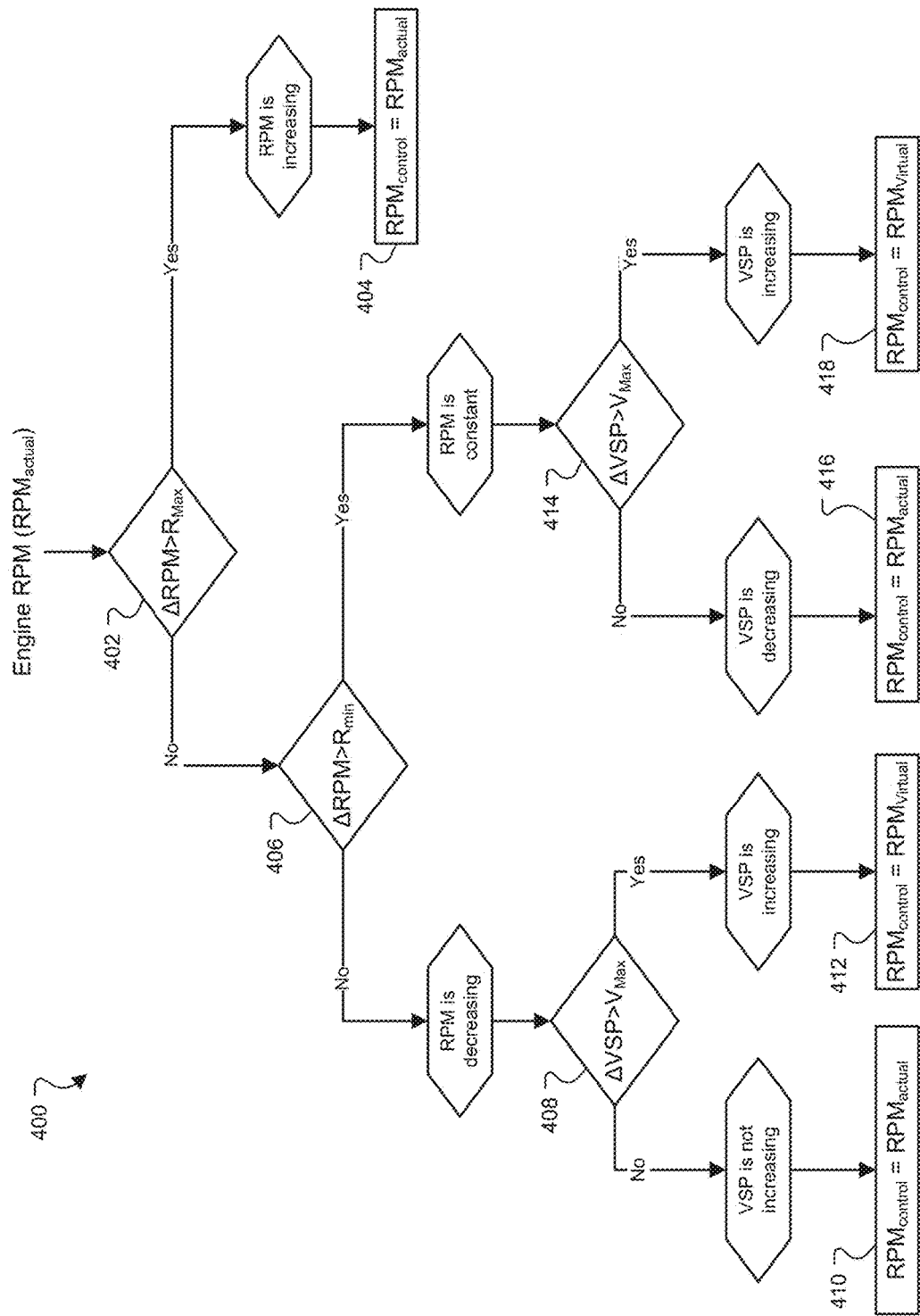
FIG. 4 is a flow diagram of an exemplary control RPM (RPM$_{control}$) selection process used in the engine sound management system.

As shown in FIG. 4, an exemplary control RPM selection process 400 residing in the virtual gearbox definition and RPM computation module 120 that implements the decisions shown in Table 1 of FIG. 3 includes determining 402 whether a change in actual RPM (ΔRPM) is greater than a predefined maximum $R_{max}$. If ΔRPM is greater than $R_{max}$, the vehicle RPM is increasing and process 400 sets 404 the control RPM equal to the actual RPM.

If ΔRPM is less than $R_{max}$, process 400 determines 406 whether ΔRPM is greater than a predefined minimum rate $R_{min}$.

If ΔRPM is less than the predefined minimum rate $R_{min}$, the actual RPM is decreasing and process 400 determines 408 whether a change in actual vehicle speed (ΔVSP) is greater than a predefined maximum vehicle speed $V_{max}$.

If ΔVSP is less than $V_{max}$, actual vehicle speed is not increasing and process 400 sets 410 the control RPM equal to the actual RPM.

If ΔVSP is greater than $V_{max}$, actual vehicle speed is increasing and process sets 412 the control RPM equal to the virtual RPM ($RPM_{virtual}$).

If process 400 determines 406 that ΔRPM is greater than $R_{min}$, the RPM is constant and process 400 determines 414 whether ΔVSP is greater than $V_{max}$.

If ΔVSP is less than $V_{max}$, the vehicle speed is decreasing and process 400 sets 416 the control RPM equal to the actual RPM. If ΔVSP is greater than $V_{max}$, the actual vehicle speed is increasing and process 400 sets 418 the control RPM equal to the virtual RPM.

It is important for the control RPM selection process 400 to exclude an abrupt increase in RPM because such behavior does not occur in actual vehicles. An abrupt decrease in RPM is permissible because it corresponds to an up-shift.

Pitch Shifting Controlled by Alternating Control RPM Using Time Dependent Discrete Gear Ratios One alternative example to the fixed gear ratio mapping described above is to freeze the current gear CVT ratio when an engine sound correction is needed. That is, the virtual fixed gear ratio can be set to an instantaneous value of the current gear ration, $GR_{CVT}(t_0)$, at a time ($t_0$) when the determination that engine sound correction is needed is made. The determination as to whether sound correction is needed may be made by way of the control RPM selection process described above with respect to FIG. 4, in which the control RPM is set to the virtual RPM when sound correction is needed. If the gear ratio is fixed, the virtual RPM ($RPM_{virtual}$) increases as the vehicle speed increases, thus producing an engine sound in such a way that the perceived pitch is increasing. The gear ratio is set back to the actual gear ratio value when the gear ratio variation exceeds a gear ratio virtual deviation value. A gear ratio deviation of the virtual gear ratio (GR) to a CVT GR may be defined as:

$$\Delta GR(t) = c \cdot \frac{GR_{virtual}(t) - GR_{CVT}(t)}{GR_{virtual}(t)} \quad (5)$$

Where c is a constant. This gear ratio deviation can be used to introduce abrupt steps in the virtual gear ratio evolution in time.

$$GR_{virtual}(t) = \begin{cases} GR_{virtual}(t-1), & \text{if correction needed, and } \Delta GR(t-1) < A \\ GR_{CVT}(t), & \text{otherwise} \end{cases} \quad (6)$$

The parameter A is tunable and represents the virtual vs. actual gear ratio deviation that triggers a gear shift.

An alternative to the above is to use a fixed gear ratio deviation:

$$\Delta GR(t) = c \cdot (GR_{desired}(t) - GR_{CVT}(t)) \quad (7)$$

where c is a constant, which can be selected as discussed above.

The rate by which the pitch shifts can be varied, not only based on the speed of the vehicle, but based on the load. In this approach, the mapping function described above is varied by changing the constant c with the engine load or the vehicle acceleration. Thus c in equations (2), (5), and (7) becomes a variable, c(t), that varies as a function of actual engine load:

$$c(t) = f(\text{EngineLoad}(t)) \quad (8)$$

that of the driver's intent, i.e. the accelerator position:

$$c(t) = f(\text{AcceleratorPosition}(t)) \quad (9)$$

or a combination of the two:

$$c(t) = f(\text{EngineLoad}(t), \text{AcceleratorPosition}(t)) \quad (10)$$

In the simplest case, the function $f(\bullet)$, would be a linear function.

Other possible applications for the CVT sound controls

The algorithms described above can be used in programming the mode of operation of an actual CVT, thus obtaining the desired pitch shift in the engine sound. In this case, the use of EHC and EHE based on the actual engine RPM could be enough to control the overall sound within the passenger cabin. Perceptual pitch shifting techniques can still be used, if needed.

Additionally, the techniques described above may be adapted to electric vehicles and/or hybrid vehicles running in electric mode.

When applying the previously described sound control techniques in electric vehicles, a virtual RPM can be determined based on vehicle speed (VSP) and predefined virtual gear ratios.

A minimum RPM and a maximum RPM can be defined. The minimum RPM and the maximum RPM can then be used as shifting points in the virtual gearbox. In some cases, the minimum RPM and the maximum RPM can be constant in time.

A virtual gear for the electric vehicle can then be computed as follows:

$$\text{where } GR_{virtual}(t) = \begin{cases} gr_{i+1}, & \text{if } RPM_{virtual}(t-1) \geq RPM_{max} \\ gr_{i-1}, & \text{if } RPM_{virtual}(t-1) \leq RPM_{min} \\ gr_i, & \text{if } RPM_{min} < RPM_{virtual}(t-1) < RPM_{max} \\ gr_1, & \text{if } RPM_{virtual}(t-1) \leq RPM_{min}, \text{ and } GR_{virtual}(t-1) = gr_1 \end{cases} \quad (11)$$

At any time, if VSP=0, the virtual gear will be switched to neutral, which will result a $GR_{virtual}(t)=0$. That is, for VSP=0, the virtual gearbox will be in neutral, with a gear ratio $gr_0$ of 0. In this case, $MRP_{virtual}(t)=0$. Once the vehicle starts moving, and the VSP>0, the virtual gearbox will shift into first gear, which has a gear ratio of $gr_1$.

In some cases, the minimum and maximum RPM threshold values can vary in time and can increase and decrease based in the vehicle acceleration. If the acceleration is high the RPM thresholds will be high, if the acceleration decreases the RPM limits will be lower.

A virtual RPM ($RPM_{virtual}$) for the electric vehicle can then be calculated according to equation (4), above (i.e., $RPM_{virtual}(t)=GR_{virtual}(t)\cdot VSP(t)\cdot CR^{-1}$). The virtual RPM can then be provided as input to an EHG module of an EHX sub-system (such as discussed above). Signals produced by the EHX sub-system, based on the virtual RPM and input received from input control logic, are transduced to acoustic energy by one or more speakers within a vehicle sound system positioned within an interior of a vehicle and provide a desired sonic experience.

In some cases, the actual RPM of the electric motor may be provided to an EHC module of the EHX sub-system. Alternatively, in some cases, the electric vehicle may not utilize an EHC module.

The application of these techniques in hybrid vehicles enables a creation of a continuous sound for when the vehicle operates in both internal combustion (IC) mode and electric vehicle mode (EV). In EV mode, the EHG module will operate on a virtual RPM that can be calculated based on vehicle speed and predefined virtual gear ratios (e.g., a first set of predefined virtual gear ratios as provided in equation 11) as discussed above with reference to electric vehicles. In IC mode, the EHG module can operate on the actual engine RPM (i.e., measured from the combustion engine) if sound correction is not necessary; or, if sound correction is necessary, then the EHG module can operate on the virtual RPM which can be determined according to equations (1) through (4) above based on based on the actual, measured RPM of the internal combustion engine, vehicle speed, and predefined virtual gear ratios (e.g., a second set of predefined virtual gear ratios as provided in equation 4).

For electric vehicles or hybrid vehicles operating in EV mode, the load processing module may receive a signal representative of the accelerator pedal position and convert it to control parameters which can be provided to the level control module.

Psychoacoustic Approach to Pitch Shifting

The control algorithm described in this document can be used to drive pitch shifting based on pitch circularity perception. In one approach, pitch can be shifted by manipulating constant frequency harmonics. For example, if signal x(t) is a sum of harmonics of a fundamental frequency, then to shift the perceived pitch, the even harmonics or odd harmonics can be gradually discontinued (e.g., by cancelling those harmonics via the EHC module) starting at the point the pitch shift is desired.

Figure 5B:
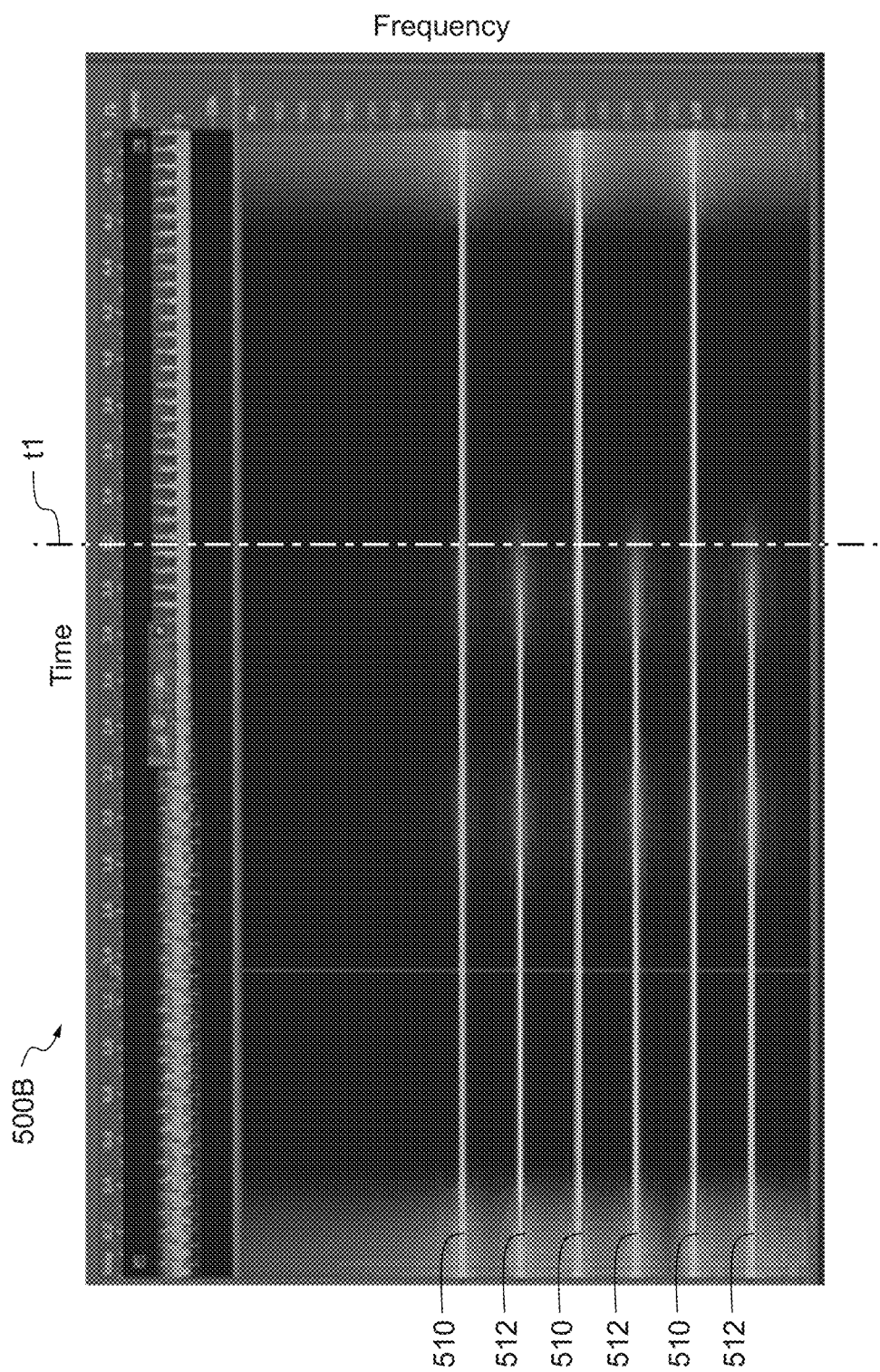

This approach is illustrated in the spectrogram 500A of FIG. 5A for the discontinuation of even harmonics 510, and the spectrogram 500B of FIG. 5B for the discontinuation of odd harmonics 512. The examples, illustrated in FIGS. 5A and 5B show certain harmonics of a substantially constant fundamental frequency, such as would be the case when the actual RPM levels off even as the vehicle speed continues to change. The harmonics being discontinued can be canceled via the EHC module 128. Thus, in some cases, a shift in perceived pitch may be achieved via cancellation of harmonics alone.

Alternatively or additionally, a shift in the perceived pitch may be induced by adding harmonics in between the existing ones. The EHG module can be utilized to generate the harmonics at the necessary level to induce the perceived pitch shift.

Alternatively or additionally, engine harmonic enhancement (EHE) can be used for the same purpose, by enhancing certain harmonics of a fundamental frequency, such as even harmonics, or every full order harmonic. The goal is to create specific ratios between neighboring harmonics, thus creating the shift in perceived pitch.

Figure 6:
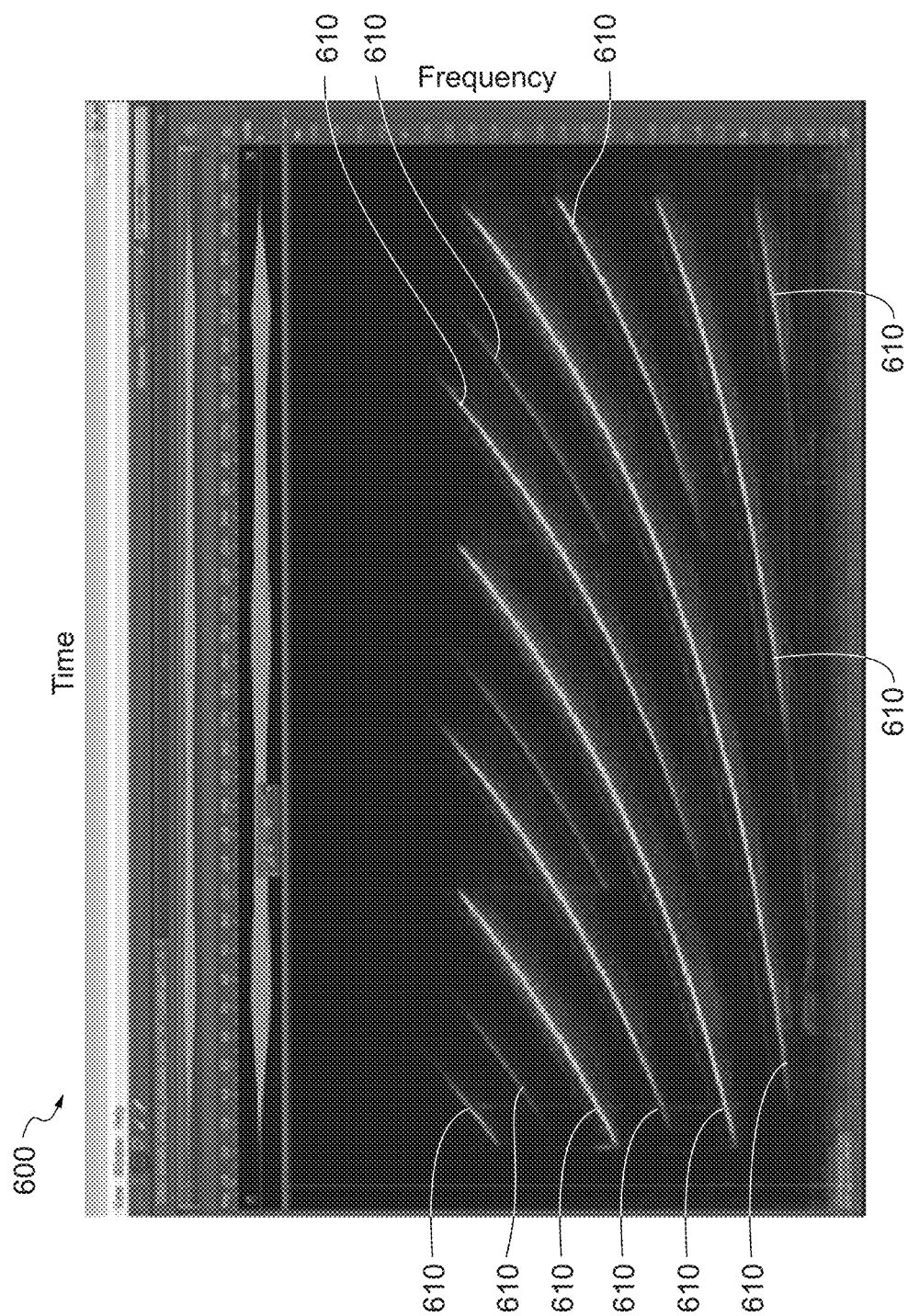

In yet another approach, illustrated in the spectrogram 600 of FIG. 6, an eternally increasing pitch can be achieved by playing harmonics in a limited frequency range. The spectrogram 600 of FIG. 6 shows a set of sine waves 610 of increasing frequency. When the frequency of a sine wave 610 approaches the upper preset frequency limit, the amplitude of that sine wave starts decreasing until it completely disappears. About the time that sine wave 610 ends playing, a new sine wave 610, of a low frequency will start playing. This new one will increase in frequency until it approaches the maximum one, at which point it will gradually decrease in level, until it becomes inaudible. This process continues for as long as it is desired.

The sine waves 610 are harmonics of a fundamental frequency that is increasing with time. "Harmonics" as used herein can include fractional (e.g., half harmonics or quarter harmonics) or full order harmonics. The fundamental frequency may, for example, be representative of the virtual RPM discussed above, or an actual vehicle RPM that increases with time.

This technique illustrated in FIG. 6 may be utilized, for example, with a vehicle equipped with an electric motor, in which case the fundamental frequency may be representative of an actual RPM of the electric motor. For example, the fundamental frequency may be determined from an actual measured RPM from the electric motor. In some cases, the electric motor may directly drive the wheels of the vehicle such that the vehicle speed varies linearly with the RPM of the electric motor, in which cases the fundamental frequency may be calculated based on a measured vehicle speed.

A signal representative of the fundamental frequency can be the input to an engine harmonic generation module, such as described above with respect to FIG. 1B, and a level control module, such as described above with respect to FIG. 1B, can be used to adjust respective gains applied to the individual harmonics of the fundamental frequency (e.g., based on measured vehicle parameters such as accelerator pedal position) such that the individual harmonics are only reproduced over the desired frequency range.

While the above describes a particular order of operations performed by certain examples, it should be understood that such order is exemplary, as alternative examples may perform the operations in a different order, combine certain operations, overlap certain operations, or the like. References in the specification to a given example indicate that the example described may include a particular feature, structure, or characteristic, but every example may not necessarily include the particular feature, structure, or characteristic.

While given components of the system have been described separately, one of ordinary skill will appreciate that some of the functions may be combined or shared in given instructions, program sequences, code portions, and the like.

The foregoing description does not represent an exhaustive list of all possible examples consistent with this disclosure or of all possible variations of the examples described. A number of examples have been described. Nevertheless, it will be understood that various modifications may be made without departing from the spirit and scope of the systems, devices, methods and techniques described here. Accordingly, other examples are within the scope of the following claims.

A number of examples have been described. Nevertheless, it will be understood that additional modifications may be made without departing from the scope of the inventive concepts described herein, and, accordingly, other examples are within the scope of the following claims.

What is claimed is:

1. A method comprising:
   in a vehicle equipped with a continuously variable transmission (CVT) and a vehicle sound system, determining if sound correction is necessary; and
   if sound correction is necessary, generating one or more harmonic signals based on an actual, measured RPM, the one or more harmonic signals being proportional to harmonics of the actual RPM, and, in the vehicle sound system, transducing the one or more harmonic signals to acoustic energy to thereby produce a shift in perceived pitch within the vehicle by reducing a harmonic sound produced by an engine of the vehicle or by adding a harmonic sound between harmonic sounds produced by the engine of the vehicle while the pitch of harmonic sounds produced by the engine of the vehicle remain substantially constant.

2. The method of claim 1 wherein determining if sound correction is necessary comprises:
   determining that a change in actual RPM ($\Delta$RPM) does not exceed a maximum value Rmax; and
   determining that a change in actual vehicle speed ($\Delta$VSP) exceeds a minimum value Vmax.

3. The method of claim 2 wherein determining if sound correction is necessary further comprises determining that $\Delta$RPM exceeds a minimum value Rmin.

4. An engine sound management system of a vehicle equipped with a continuously variable transmission (CVT) and a vehicle sound system, the engine sound management system comprising:
   circuitry for determining if sound correction is necessary, and if sound correction is necessary, for generating one or more harmonic signals based on an actual, measured RPM, the one or more harmonic signals being proportional to harmonics of the actual RPM; and
   circuitry for causing the vehicle sound system to transduce the one or more harmonic signals to acoustic energy to thereby produce a shift in perceived pitch within the vehicle by reducing a harmonic sound produced by an engine of the vehicle or by adding a harmonic sound between harmonic sounds produced by the engine of the vehicle while the pitch of harmonic sounds produced by the engine of the vehicle remain substantially constant.

5. The system of claim 4 wherein circuitry for determining if sound correction is necessary comprises:
   circuitry for determining that a change in actual RPM ($\Delta$RPM) does not exceed a maximum value Rmax; and
   circuitry for determining that a change in actual vehicle speed ($\Delta$VSP) exceeds a minimum value Vmax.

6. The circuitry of claim 5 wherein the circuitry for determining if sound correction is necessary further comprises circuitry for determining that $\Delta$RPM exceeds a minimum value Rmin.

* * * * *